(12) United States Patent
Lee et al.

(10) Patent No.: US 12,096,105 B2
(45) Date of Patent: Sep. 17, 2024

(54) CAMERA MODULE INCLUDING PRINTED CIRCUIT BOARD, AND ELECTRONIC DEVICE COMPRISING SAME

(71) Applicant: Samsung Electronics Co., Ltd., Gyeonggi-do (KR)

(72) Inventors: Gwanyong Lee, Gyeonggi-do (KR); Cheol Hwang, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 191 days.

(21) Appl. No.: 17/677,522

(22) Filed: Feb. 22, 2022

(65) Prior Publication Data
US 2022/0182516 A1    Jun. 9, 2022

Related U.S. Application Data

(63) Continuation of application No. PCT/KR2020/009043, filed on Jul. 9, 2020.

(30) Foreign Application Priority Data

Aug. 22, 2019  (KR) .................. 10-2019-0103059

(51) Int. Cl.
*H04N 23/54*  (2023.01)
*H05K 1/18*   (2006.01)

(52) U.S. Cl.
CPC ............. *H04N 23/54* (2023.01); *H05K 1/181* (2013.01); *H05K 1/189* (2013.01); *H05K 2201/10151* (2013.01)

(58) Field of Classification Search
None
See application file for complete search history.

(56) References Cited

U.S. PATENT DOCUMENTS 6,603,107 B2 * 8/2003  Miyake ............... H01R 4/04
                                                250/239
7,300,816 B2 * 11/2007 Manansala ........ H01L 23/3121
                                              257/E23.065

(Continued)

FOREIGN PATENT DOCUMENTS

JP     2002-111221      4/2002
KR    1020070054304     5/2007

(Continued)

OTHER PUBLICATIONS

PCT/ISA/210 Search Report issued on PCT/KR2020/009043 pp. 3.

(Continued)

*Primary Examiner* — James M Hannett
(74) *Attorney, Agent, or Firm* — The Farrell Law Firm, P.C.

(57) ABSTRACT

A camera module is provided and includes an image sensor and a printed circuit board (PCB) structure electrically coupled to the image sensor. The PCB structure may include a first layer disposed under the image sensor, a second layer disposed between the first layer and the image sensor, a first conductive pattern formed on the first layer and electrically coupled to the image sensor through one end portion of the first conductive pattern so as to transfer a signal obtained from the image sensor to an external electronic component, and a first open space formed in the second layer such that the one end portion of the first conductive pattern is exposed to a surface of the PCB structure.

18 Claims, 14 Drawing Sheets

(56) References Cited

U.S. PATENT DOCUMENTS

| | | | |
|---|---|---|---|
| 7,659,617 B2* | 2/2010 | Kang | H05K 1/189 |
| | | | 257/E21.705 |
| 7,714,931 B2 | 5/2010 | Singh et al. | |
| 10,771,666 B2* | 9/2020 | Wang | H04N 23/54 |
| 11,032,459 B2 | 6/2021 | Jung et al. | |
| 2005/0174469 A1 | 8/2005 | Cho et al. | |
| 2007/0117423 A1 | 5/2007 | Kim et al. | |
| 2007/0223913 A1* | 9/2007 | Lee | H04N 23/57 |
| | | | 396/529 |
| 2019/0068846 A1 | 2/2019 | Jung et al. | |

FOREIGN PATENT DOCUMENTS

| | | |
|---|---|---|
| KR | 1020070096303 | 10/2007 |
| KR | 1020130040425 | 4/2013 |
| KR | 10-1619045 | 5/2016 |
| KR | 10-1872758 | 6/2018 |
| KR | 1020190021118 | 3/2019 |

OTHER PUBLICATIONS

PCT/ISA/237 Written Opinion issued on PCT/KR2020/009043 pp. 5.
Korean Office Action dated Mar. 20, 2024 issued in counterpart application No. 10-2019-0103059, 16 pages.

* cited by examiner

CAMERA MODULE INCLUDING PRINTED CIRCUIT BOARD, AND ELECTRONIC DEVICE COMPRISING SAME

CROSS-REFERENCE TO RELATED APPLICATION(S)

This application is a Bypass Continuation Application of PCT International Application No. PCT/KR/2020/009043, which was filed on Jul. 9, 2020, in the Korean Intellectual Property Office, and claims priority to Korean Patent Application No. 10-2019-0103059, which was filed on Aug. 22, 2019, in the Korean Intellectual Property Office, the content of each of which is incorporated herein by reference.

BACKGROUND

1. Field

The disclosure relates generally to a camera module including a printed circuit board (PCB), and an electronic device including the camera module.

2. Description of Related Art

With the trend of small-sized electronic devices becoming more commonplace, camera modules provided in the electronic devices are also becoming small in size.

A PCB may include a plurality of layers for space efficiency. Since a conductive pattern may be disposed in each of the plurality of layers, a space in the electronic device may be effectively utilized, compared to a case where a single-layer conductive pattern is disposed. Meanwhile, a conductive via may be used for a connection between conductive patterns disposed on different layers.

The conductive via may be included on a path through which a signal produced from an image sensor is transferred to a component of the electronic device. When the conductive via is included, it is complicated to dispose a transmission line extending from the image sensor, and the signal produced from the image sensor may be distorted.

SUMMARY

The present disclosure has been made to address the above-mentioned problems and disadvantages, and to provide at least the advantages described below.

According to an aspect of the disclosure, a camera module includes an image sensor and a PCB structure electrically coupled to the image sensor. The PCB structure may include a first layer disposed under the image sensor, a second layer disposed between the first layer and the image sensor, a first conductive pattern formed on the first layer and electrically coupled to the image sensor through one end portion of the first conductive pattern so as to transfer a signal obtained from the image sensor to an external electronic component, and a first open space formed in the second layer such that the one end portion of the first conductive pattern is exposed to a surface of the PCB structure.

According to another aspect of disclosure, an electronic device includes a housing constituting an inner space, at least one electronic component disposed to the inner space, and a camera module disposed to the inner space. The camera module may include an image sensor and a PCB structure electrically coupled to the image sensor. The PCB structure may include a first layer disposed under the image sensor, a second layer disposed between the first layer and the image sensor, a first conductive pattern formed on the first layer and electrically coupled to the image sensor through one end portion of the first conductive pattern so as to transfer a signal obtained from the image sensor to the at least one external electronic component, and a first open space formed in the second layer such that the one end portion of the first conductive pattern is exposed to a surface of the PCB structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
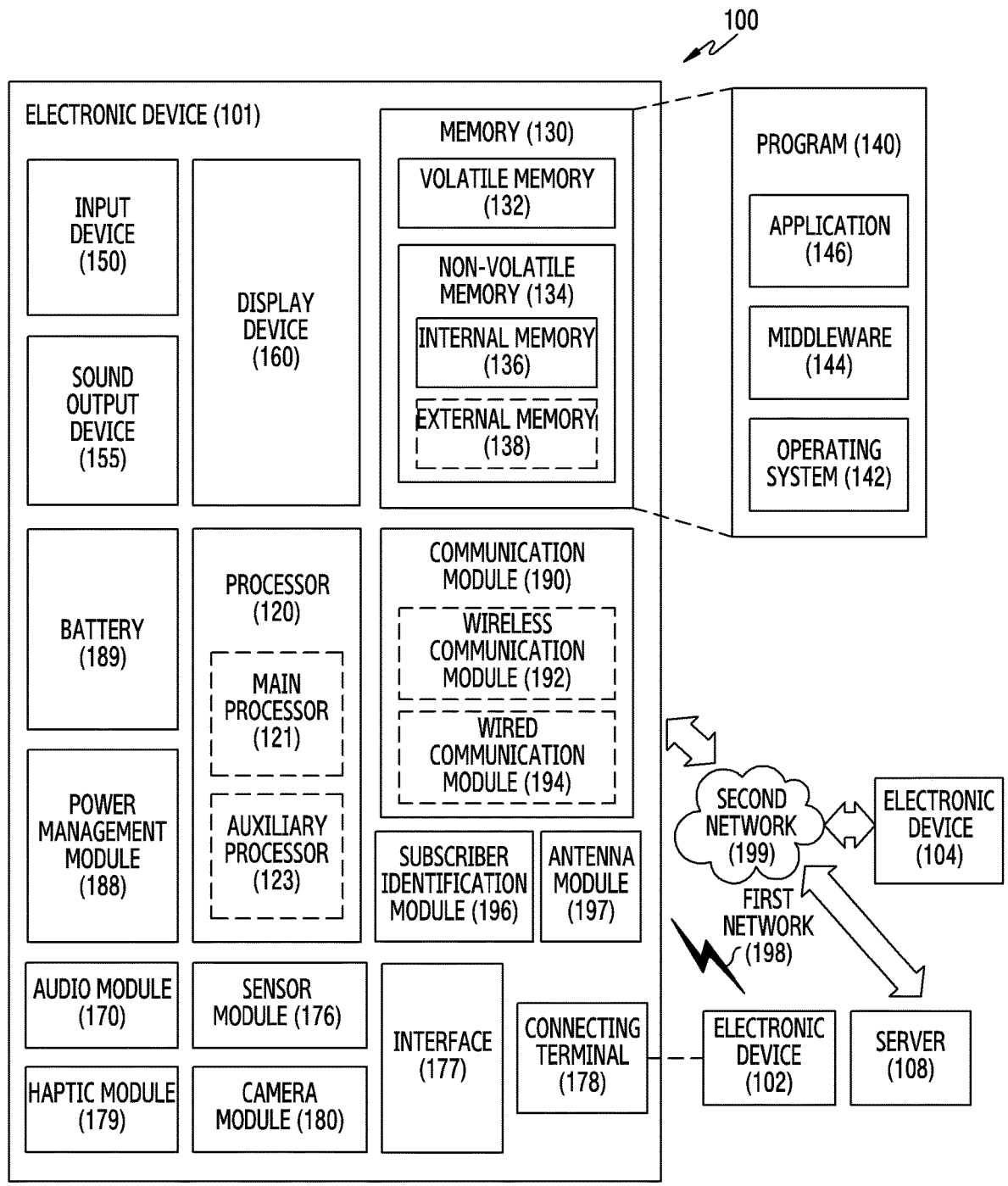
FIG. 1 is a block diagram of an electronic device in a network environment, according to an embodiment.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

Various embodiments of the disclosure may provide a structure of a PCB in which a conductive via for coupling a conductive pattern and a port of an image sensor may be omitted, and an electronic device including the PCB.

According to various embodiments, in a camera module and an electronic device including the camera module, a conductive via which may be included in a path through which a signal produced from an image sensor is transferred may be omitted or the number of conductive vias may be decreased, thereby decreasing distortion of the signal and effectively designing the camera module.

FIG. 1 is a block diagram illustrating an electronic device 101 in a network environment 100, according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in nonvolatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state e.g., power or temperature) of the electronic device 101 or an environmental state e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or IR Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type from, the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
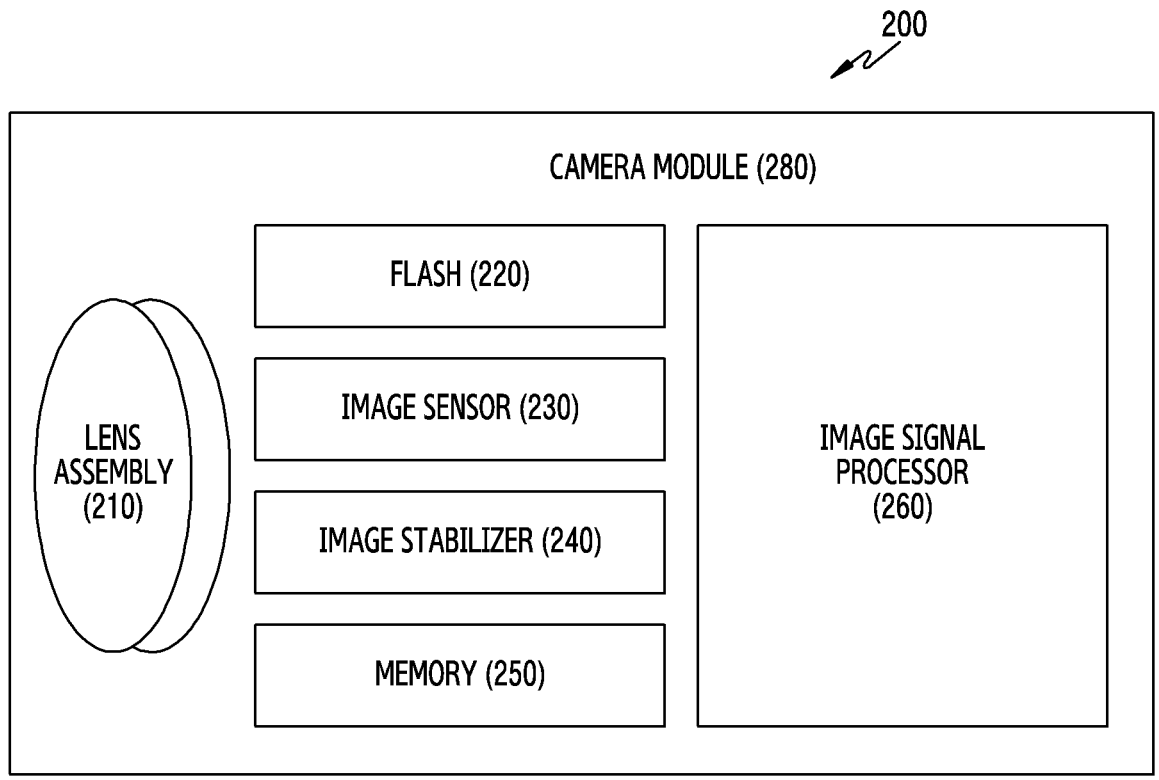
FIG. 2 is a block diagram illustrating a camera module, according to an embodiment.

FIG. 2 is a block diagram 200 illustrating the camera module 280, according to an embodiment.

Referring to FIG. 2, the camera module 280 may include a lens assembly 210, a flash 220, an image sensor 230, an image stabilizer 240, memory 250 (e.g., buffer memory), or an ISP 260. The lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light reflected from an object. According to an embodiment, the flash 220 may include one or more light emitting diodes (LEDs) (e.g., a red-green-blue (RGB) LED, a white LED, an IR LED, or an ultraviolet (UV) LED) or a xenon lamp. The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as an RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor or an acceleration sensor disposed inside or outside the camera module 180. According to an embodiment, the image stabilizer 240 may be implemented, for example, as an optical image stabilizer. The memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image or a high-resolution image) may be stored in the memory 250, and its corresponding copy image (e.g., a low-resolution image) may be previewed via the display device 160. Thereafter, if a specified condition is met (e.g., by a user's input or system command), at least part of the raw image stored in the memory 250 may be obtained and processed, for example, by the ISP 260. According to an embodiment, the memory 250 may be configured as at least part of the memory 130 or as a separate memory that is operated independently from the memory 130.

The ISP 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the ISP 260 may perform control (e.g., exposure time control or read-out timing control) with respect to at least one of the components included in the camera module 180 (e.g., the image sensor 230). An image processed by the ISP 260 may be stored back in the memory 250 for further processing, or may be provided to an external component (e.g., the memory 130, the display device 160, the electronic device 102, the electronic device 104, or the server 108) outside the camera module 180. According to an embodiment, the ISP 260 may be configured as at least part of the processor 120, or as a separate processor that is operated independently from the processor 120. If the ISP 260 is configured as a separate processor from the processor 120, at least one image processed by the image signal processor 260 may be displayed, by the processor 120, via the display device 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of "A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspects (e.g., importance or order). It is to be understood that if an element (e.g., a first element) is referred to, with or without the terms or expressions, "operatively", "communicatively", "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3A:
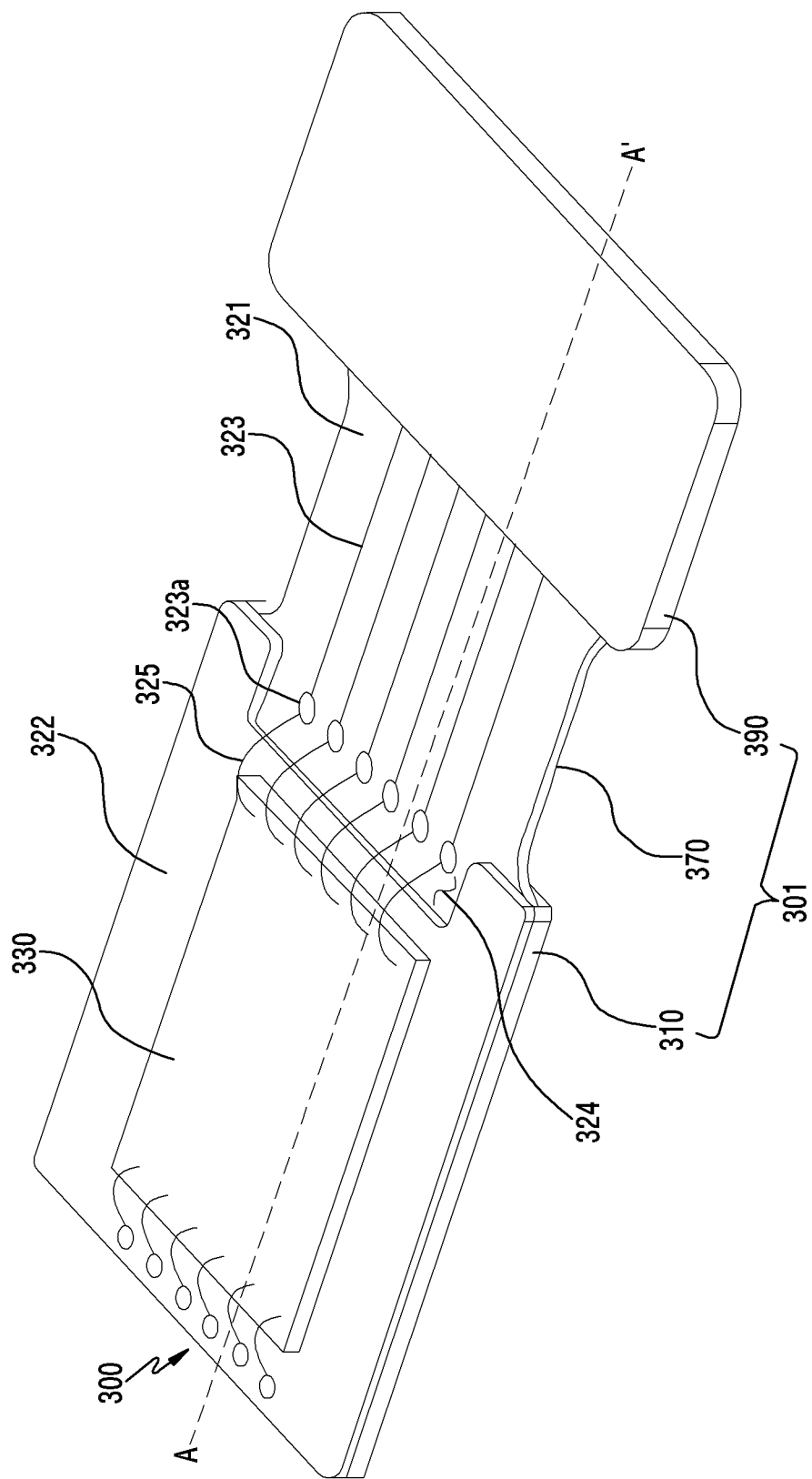
FIG. 3A is a plan view of a PCB structure according to an embodiment.
Figure 3B:
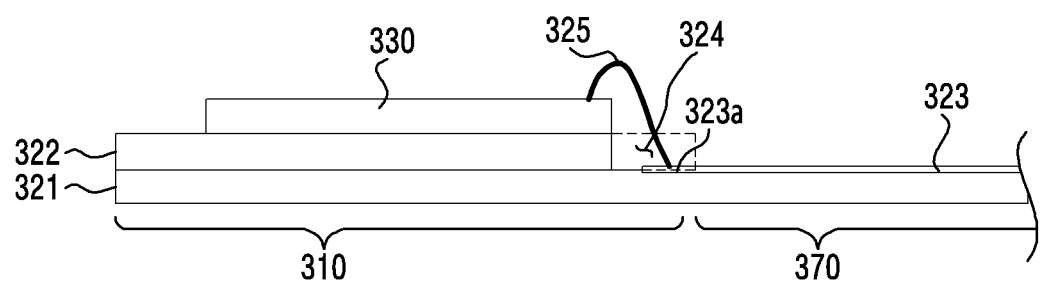
FIG. 3B is a cross-sectional view of a camera module including the PCB structure of FIG. 3A, taken along the line A-A', according to an embodiment.

FIG. 3A is a plan view of a PCB structure, according to an embodiment, and FIG. 3B is a cross-sectional view of a camera module including the PCB structure of FIG. 3A, taken along the line A-A', according to an embodiment.

Referring to FIG. 3A and FIG. 3B, a camera module 300 includes a PCB structure 301 and an image sensor 330 disposed on the PCB structure 301.

The PCB structure 301 may include an image sensor portion 310 having the image sensor 330 disposed therein, a connector portion 390 electrically coupling the camera module 300 to a component of an electronic device 101, and/or an extension portion 370 coupling the image sensor portion 310 and the connector portion 390.

The PCB structure 301 may include a first layer 321, a second layer 322 disposed on the first layer 321, and/or a conductive pattern 323 formed on the first layer 321 and electrically coupled to the image sensor 330.

The second layer 322 may be constructed such that the conductive pattern 323 formed on the first layer 321 is exposed to a surface of the PCB structure 301. The second layer 322 may be constructed to include an open space 324 corresponding to a region to which one end portion 323a of the conductive pattern 323 is disposed. Therefore, the conductive pattern 323 formed on first layer 321 may be partially exposed through the open space 324.

The image sensor 330 may be electrically coupled to the end portion 323a of the conductive pattern 323 formed on the first layer 321. Since the second layer 322 in contact with the image sensor 330 does not cover the end portion 323a of the conductive pattern 323, the image sensor 330 and the conductive pattern 323 may be coupled directly through a conductive member 325. For example, the image sensor 330 and the end portion 323a of the conductive pattern 323 may be coupled through wire bonding.

The PCB structure 301 may further include at least one layer in addition to the first layer 321 and the second layer 322. The at least one layer may be disposed under the first layer 321, or may be disposed between the first layer 321 and the second layer 322.

When the at least one layer is disposed between the first layer 321 and the second layer 322, the at least one layer may include the open space 324 corresponding to the end portion 323a of the conductive pattern 323 such that the end portion 323a of the conductive pattern 323 is exposed to the surface of the PCB structure 301. For example, when a third layer exists between the first layer 321 and the second layer 322, the open space 324 for exposing the end portion 323a of the conductive pattern 323 may be included in both the second layer and the third layer.

When a conductive via 319 is included, a signal produced from the image sensor 330 may be distorted. The conductive via 319 may function as a capacitive element or an inductive element according to a frequency of a signal passing through the conductive via 319 to change an impedance of a signal transfer path. For example, the conductive via 319 may act as a capacitance with respect to a high-frequency signal produced from the image sensor. When there is a change in the impedance of the signal transfer path because the conductive via 319 is included on the signal transfer path of the image sensor 330, the high-frequency signal may be distorted. When the conductive via 319 is included, the conductive pattern shall be disposed by bypassing the conductive via 319, which may result in a complicated pattern design on a substrate. For example, a port group of the image sensor 330 (e.g., a second port group 332 of an image sensor 330 of FIG. 4B) may transfer an image signal through the conductive via 319 or the conductive pattern. Since the conductive via 319 is included on the path through which the image signal is transferred, the image signal may be distorted. In addition, since the conductive via 319 is formed by passing through a plurality of layers, when the conductive pattern is formed on the layers, it is necessary to bypass the conductive via 319, which may result in a complicated pattern design.

The distortion of the image signal may be suppressed by omitting the conductive via 319 on the path through which the image signal is transferred. In case of omitting the conductive via 319 on the path through which the image signal is transferred, it is not necessary to bypass the conductive via when the conductive pattern 323 is formed on the layers 321 and 322 included in the PCB structure 301, which may make it easy to design the pattern.

By omitting the conductive via 319 on the signal transfer path of the image sensor 330, a component of the camera module 300 may be effectively disposed on the PCB structure 301. It is possible to make the camera module 300 small in size by effectively disposing the component of the camera module 300. For example, when a component such as an electrically erasable programmable read-only memory (EEPROM) or a micro lead-frame chip carrier (MLCC) included in the camera module 300 is disposed to the image sensor portion 310, the component may be disposed in such a way that the image sensor portion 310 is reduced in size.

By omitting the conductive via on the signal transfer path of the image sensor 330, the number of conductive vias between the image sensor 330 and a ground disposed to some layers of the image sensor portion 310 may be decreased. Since the number of the conductive vias 319 disposed between the image sensor 330 and the ground is decreased, there may be an advantage in that the ground for the image sensor 330 becomes wider. The wider ground may result in improvement of a signal characteristic of the image sensor 330, thereby obtaining an image of good quality.

Some ports of the image sensor 330 may correspond to ports conforming to a mobile industry processor interface (MIPI) standard. When the some ports correspond to MIPI ports, a length of conductive patterns corresponding to the respective ports shall satisfy a specific condition. When the conductive via 319 exists on the signal transfer path of the image sensor 330 and thus the conductive pattern 323 has to bypass the conductive via 319, the design of the conductive pattern 323 may be complicated in order to satisfy the length condition of the conductive pattern 323.

In case of omitting a conductive via 319 on a path through which a signal produced from a port corresponding to the MIPI is transferred among the ports of the image sensor 330, since the conductive pattern 323 included on the path does not have to bypass the conductive via 319, it may be easy to satisfy a condition required in the MIPI standard.

Figure 4A:
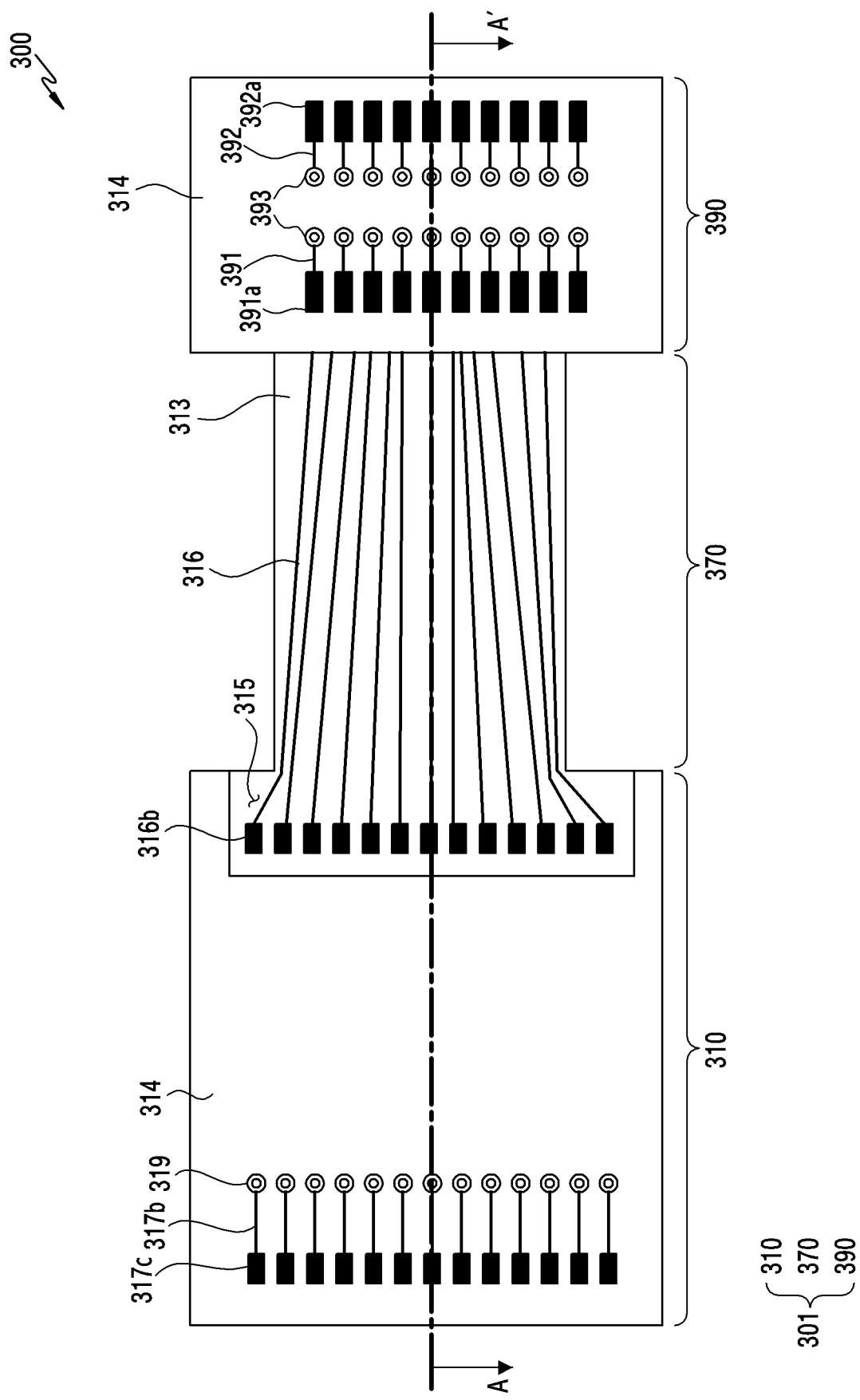
FIG. 4A is a plan view of a PCB structure, according to an embodiment.
Figure 4B:
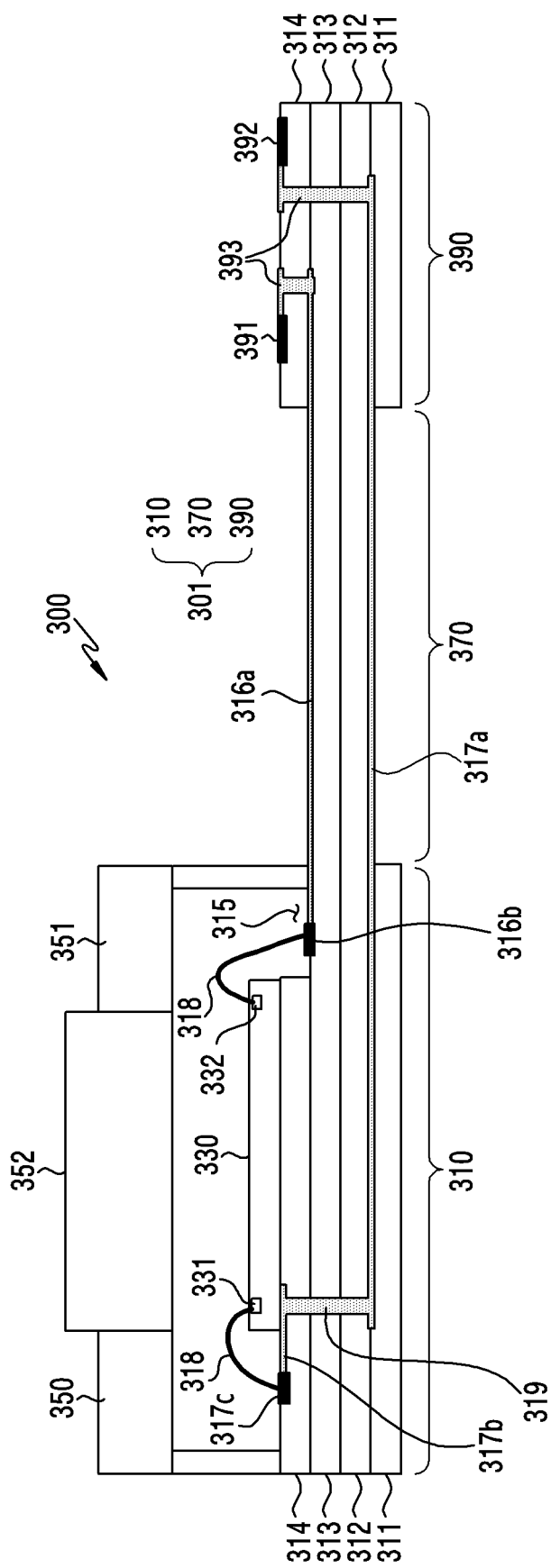
FIG. 4B is a cross-sectional view of a camera module including the PCB structure of FIG. 4A, taken along the line A-A', according to an embodiment.
Figure 4C:
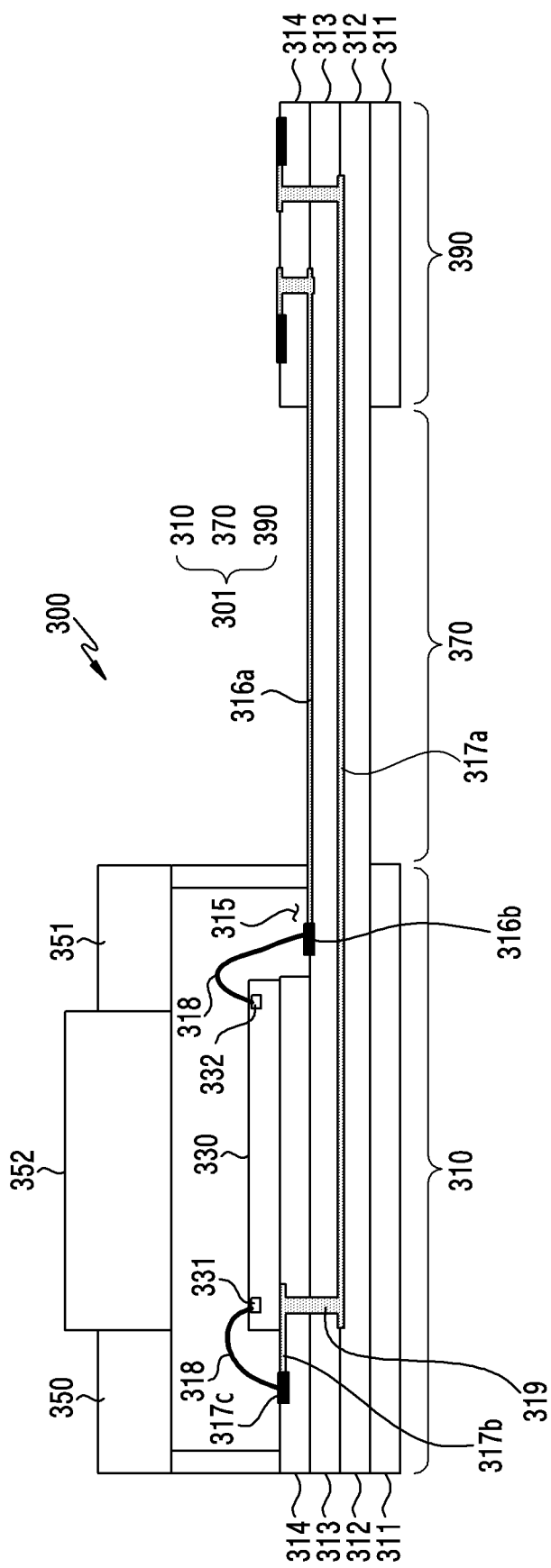
FIG. 4C is a cross-sectional view of a camera module including the PCB structure of FIG. 4A, taken along the line A-A', according to an embodiment.

FIG. 4A is a plan view of a PCB structure, according to an embodiment, and FIG. 4B and FIG. 4C are cross-sectional views of a camera module including the PCB structure of FIG. 4A, taken along the line A-A', according to various embodiments.

Referring to FIG. 4A to FIG. 4C, a camera module 300 includes a PCB structure 301, an image sensor 330 disposed on the PCB structure 301, and a camera housing 350 disposed to a position corresponding to the image sensor 330 and including a lens 352 and a member 351 supporting the lens 352 to the PCB structure 301.

The PCB structure 301 may include an image sensor lotion 310 having the image sensor 330 disposed therein, a connector portion 390 electrically coupling the camera module 300 to a component of an electronic device 101, and/or an extension portion 370 coupling the image sensor portion 310 and the connector portion 390.

The image sensor portion 310 may include a first layer 311, a second layer 312 disposed on the first layer 311, a third layer 313 disposed on the second layer 312, and/or a fourth layer 314 disposed on the third layer 313.

A plurality of layers of the image sensor portion 310 may include a flexible layer. For example, the first layer 311, the second layer 312, the third layer 313, and/or the fourth layer 314 may include a flexible material.

In order for the image sensor 330 to be stably coupled to the PCB structure 301, the image sensor portion 310 may have a specific level of rigidity. At least one of the plurality of layers included in the image sensor portion 310 may include a rigid material. For example, the first layer 311 and/or the fourth layer 314 may include a rigid material. Since some layers of the image sensor portion 310 include a rigid material, the image sensor 330 may be firmly attached to the image sensor portion 310.

The extension portion 370 may include at least one layer extending from the layer of the image sensor portion 310 to the connector portion 390. For example, the extension portion 370 may be a portion from which the second layer 312 and/or third layer 313 of the image sensor portion 310 extend. The second layer 312 and the third layer 313 may extend to the connector portion 390. The first layer 311 and the fourth layer 314 may not be constructed in the extension portion 370.

Layers extending from the image sensor portion 310 to construct the extension portion 370 may include a flexible material. For example, the extended second layer 312 and third layer 313 may include a flexible material. When the extension portion 370 includes a flexible layer, a positional relationship between the image sensor portion 310 and the connector portion 390 may be flexible. For example, one face of the image sensor portion 310 and one face of the connector portion 390 may be disposed to be perpendicular. In addition, a distance from one face of the lens 352 to the second layer 312 of the image sensor portion 310 may be different from a distance from one face of the lens 352 to the second layer 312 of the connector portion 390.

The connector portion 390 may include a plurality of layers. Some of the plurality of layers may be layers extending from the image sensor portion 310. The connector portion 390 may include the first layer 311, the second layer 312, the third layer 313, and/or the fourth layer 314, and the second layer 312 and the third layer 313 may be layers extending from the image sensor portion 310.

In order for a connector which receives a signal of the image sensor 330 to be stably coupled to the PCB structure 301, the connector portion 390 may have a specific rigidity. At least any one of the plurality of layers included in the image sensor portion 310 may include a rigid material. For example, the first layer 311 and/or the fourth layer 314 may include a rigid material.

The PCB structure 301 may include conductive patterns 316a, 317a, and 317b such that the image sensor 330 is electrically coupled to a component of the electronic device. The conductive patterns 316a, 317a, and 317b may be formed on at least any one of a plurality of layers of the PCB structure 301.

The image sensor portion 310 may include the first conductive pattern 317a formed under the second layer 312, the second conductive pattern 317b coupled to the first conductive pattern 317a and formed on the fourth layer 314, and/or the third conductive pattern 316a formed on the third layer 313. The first conductive pattern 317a and the second conductive pattern 317b are formed on respective different layers, and thus may be coupled through a conductive via 319. The conductive via 319 may pass through the second layer 312, the third layer 313, and the fourth layer 314. Referring to FIG. 4C, the first conductive pattern 317a may be formed on the second layer 312. The conductive via 319 may pass through the third layer 313 and the fourth layer 314.

An end portion 317c of the second conductive pattern 317b may be electrically coupled to a first end port group 331 of the image sensor 330 corresponding to the end portion 317c of the second conductive pattern 317b through wire boding 318. An end portion 316b of the third conductive pattern 316a may be electrically coupled to a second port group 332 of the image sensor 330 corresponding to the end portion 316b of the third conductive pattern 316a through the wire bonding 318.

The conductive patterns 316a and 317a may extend to the connector portion 390 through the extension portion 370. For example, the first conductive pattern 317a and the third conductive pattern 316a may extend from the image sensor portion 310 to the extension portion 370 and the connector portion 390. In the extension portion 370, the conductive patterns 316a and 317a may be formed on a surface of the extension portion 370. Since the first layer 311 and the fourth layer 314 are not constructed in the extension portion 370, the first conductive pattern 317a and the second conductive pattern 316a may be visible from the outside. A separate coding layer may be disposed on a corresponding conductive pattern to protect and isolate the conductive patterns 316a and 317a formed on the surface of the extension 370 from the outside. Referring to FIG. 4C, the first conductive pattern 317a is formed on the second layer 312, and thus may not be exposed to the outside in the extension portion.

In the connector portion 390, the extended conductive patterns 316a and 317a may be electrically coupled to a component of the electronic device. The connector portion 390 may include the conductive patterns 316a and 317a extending from the sensor portion 310, a conductive via 393, fourth conductive patterns 391, fifth conductive patterns 392, end portions 391a of the fourth conductive patterns 391, or end portions 392a of the fifth conductive patterns. Signals obtained from the image sensor 330 may be transferred to an external electronic component through the conductive patterns 316a, 317a, 391, and 392 and the conductive via 393. The shape of the connector portion 390 of FIG. 4A to FIG. 4C is not limited to the illustrated shape.

The image sensor portion 310 of the PCB structure 301 may not include the conductive via 319 on a path of a signal produced from the image sensor. For example, the second port group 332 may be directly coupled to the end portion 316b of the third conductive pattern 316a formed on the third layer 313 without the conductive via 319. In order for the second port group 332 to be directly coupled to the end portion 316b of the third conductive pattern 316a, the fourth layer 314 may not be constructed in a region corresponding to a region in which the end portion 316b of the third conductive pattern 316a is disposed. The end portion 317c of the second conductive pattern 317b and/or the end portion 316b of the third conductive pattern 316a may be formed to have a width thicker than a pattern to make it easy to process the wire boding 318 with the first port group 331 and/or the second port group 332.

The second port group 332 of the image sensor 330 may be directly coupled to the end portion 316b of the third conductive pattern 316a formed on the third layer 331 through the wire bonding 318. In the image sensor portion 310, the third conductive pattern 316a may be formed on the third layer 313. In a region in which the end portion 316b of the third conductive pattern 316a is disposed, at least part of the third layer 313 may be a layer constituting a surface of the PCB structure 301. The fourth layer 314 may be constructed to overlap with some regions of the third layer 313, and may not be constructed in a region in which the end portion 316b of the third conductive pattern 316a is disposed. For example, referring to FIG. 4B, when the fourth layer 314 is viewed, at least part of the third conductive pattern 316a formed on the third layer 313 may be visible.

In the fourth layer 314, an open space 315 may be formed, corresponding to the end portion 316b of the third conductive pattern 316a. For example, the fourth layer 314 may include an opening in the open space 315 corresponding to the end portion 316b of the third conductive pattern 316a. The opening may include a closed-shaped side face. The opening may include a side face coupled to the side face of the fourth layer 314. Since the fourth layer 314 is not constructed between the second port group 332 and the end portion 316b of the third conductive pattern 316a, the second port group 332 and the third conductive pattern 316a may be electrically coupled directly through the wire bonding 318 without the conductive via.

The distortion of the image signal may be suppressed by omitting the conductive via on the path through which the image signal is transferred. In case of omitting the conductive via on the path through which the image signal is transferred, it is not necessary to bypass the conductive via when the conductive patterns 316a and 317a are formed on the layers 311, 312, 313, and 314 included in the PCB structure 301, which may make it easy to design the pattern. For example, in the image sensor portion 310, a path through which a signal from the second port group 332 of the image sensor 330 is transferred may include the second port group 332, the wire bonding 318, or the third conductive pattern 316a. Since the conductive via is not included on a signal transfer path, the distortion of the signal corresponding to the second port group 332 may be suppressed. In addition, since the conductive via is omitted, it is possible to avoid that the third conductive pattern 316a formed on the third layer 313 is disposed in a complicated manner.

Figure 5A:
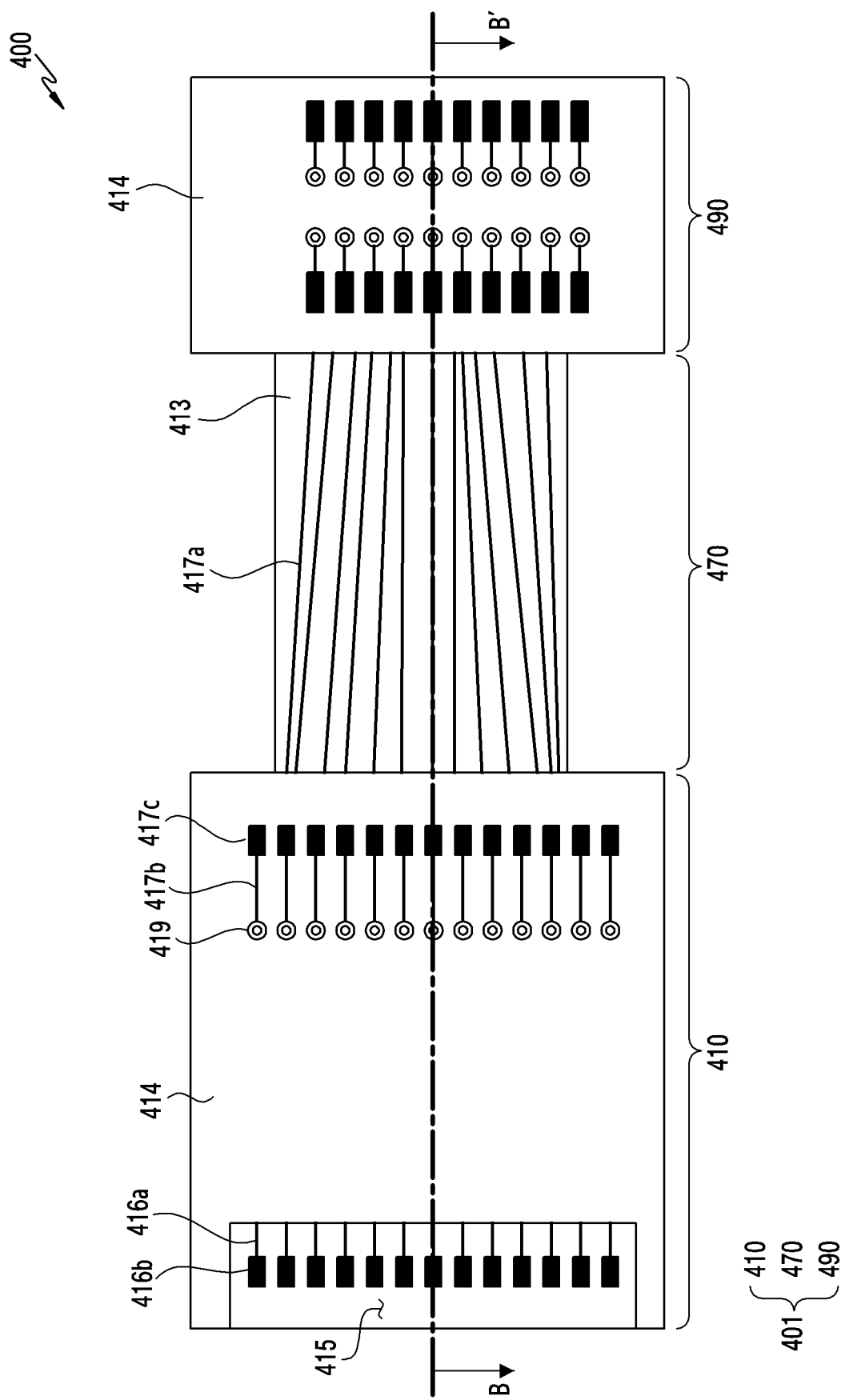
FIG. 5A illustrates an image sensor in the camera module of FIG. 4, according to an embodiment.
Figure 5B:
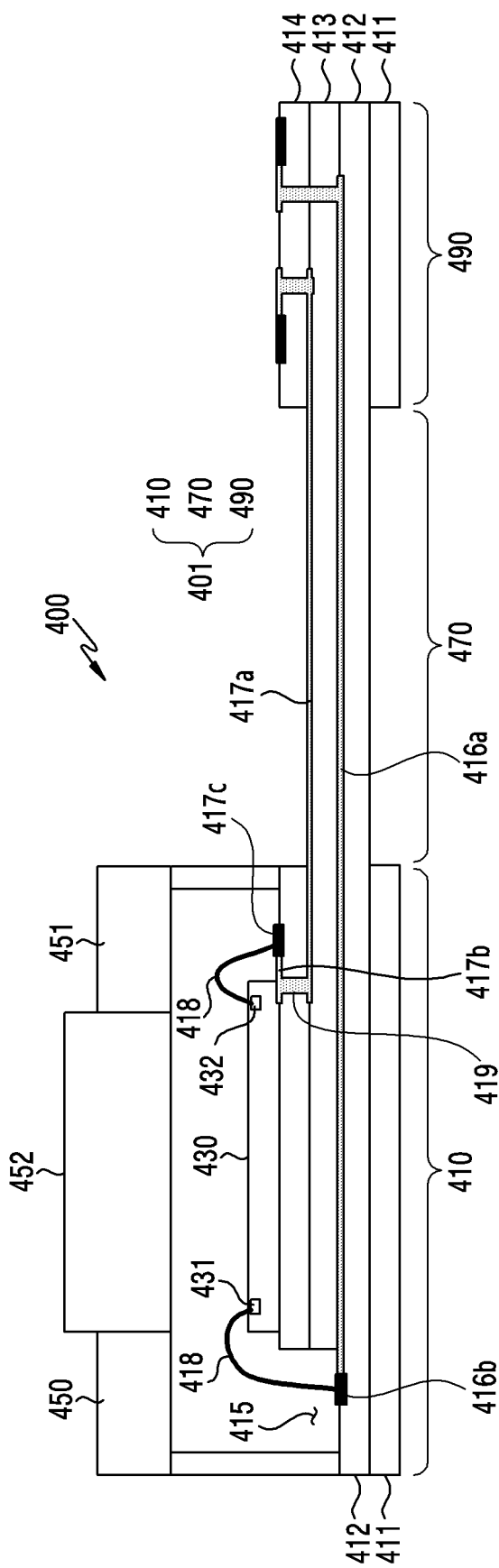
FIG. 5B is a cross-sectional view of the camera module of FIG. 5A, taken along the line B-B', according to an embodiment.

FIG. 5A illustrates a PCB structure, according to an embodiment. FIG. 5B is a cross-sectional view of a camera module 400 including the PCB structure of FIG. 5A, taken along the line B-B', according to an embodiment.

Referring to FIG. 5A and FIG. 5B, the camera module 400 includes a PCB structure 401, an image sensor 430 disposed on the PCB structure 401, and a camera housing 450 disposed to a position corresponding to the image sensor 430 and including a lens 452 and/or a member 451 supporting the lens 452 to the PCB structure 401.

The PCB structure 401 may include an image sensor portion 410 having the image sensor 430 disposed therein, a connector portion 490 electrically coupling the camera module 400 to a component of an electronic device 101, and/or an extension portion 470 coupling the image sensor portion 410 and the connector portion 490.

The image sensor portion 410 may include a first layer 411, a second layer 412 disposed between the first layer 411 and the image sensor 430, a third layer 413 disposed between the second layer 412 and the image sensor 430, and/or a fourth layer 414 disposed between the third layer 413 and the image sensor 430. One of a plurality of layers included in the image sensor portion 410 may overlap with some regions of another layer included in the plurality of layers. For example, the third layer 413 may be constructed to overlap with some regions of the second layer 412.

Some layers (e.g., the first layer 411 or the fourth layer 414) of the PCB structure 401 may include a rigid material. The remaining layers (e.g., the second layer 412 or the third layer 413) may include a flexible material.

The extension portion 470 may include a plurality of layers extending from at least one layer of the image sensor portion 410 to the connector portion 490. For example, the extension portion 470 may be a portion from which the second layer 412 and/or third layer 413 of the image sensor portion 410 extend. The second layer 412 or the third layer 413 may extend to the connector portion 490. The extension portion 470 may include a flexible layer. When the extension portion 470 includes the flexible layer, a positional relationship between the image sensor portion 410 and the connector portion 490 may be flexible. For example, one face of the image sensor portion 410 and one face of the connector portion 490 may be disposed to be perpendicular. In addition, a distance from one face of the lens 452 to the second layer 412 of the image sensor portion 410 may be different from a distance from one face of the lens 452 and the second layer 412 of the connector portion 490.

The connector portion 490 may include a plurality of layers. Some of the plurality of layers may be layers extending from the image sensor portion 410. For example, the connector portion 490 may include the first layer 411, the second layer 412, the third layer 413, and/or the fourth layer 414. The third layer 413 and/or the fourth layer 414 may be layers extending from the image sensor portion 410. The first layer 411 of the connector portion 490 may be separated from the first layer 411 of the image sensor portion 410. For example, the first layer 411 may not be constructed in the extension portion 470. The fourth layer 414 of the connector portion 490 may be separated from the fourth layer 414 of the image sensor portion 410. For example, the fourth layer 414 may not be constructed in the extension portion 470.

The PCB structure 401 may include conductive patterns 416a, 417a, and 417b such that the image sensor 430 is electrically coupled to a component of the electronic device. The conductive patterns 416a, 417a, and 417b may be formed on at least any one of a plurality of layers of the PCB structure 401.

The image sensor portion 410 may include the first conductive pattern 416a formed on the second layer 412, the second conductive pattern 417a formed on the third layer 413, or the third conductive pattern 417b coupled to the second conductive pattern 417a and formed on the fourth layer 414.

The second conductive pattern 417a and the third conductive pattern 417b may be formed on different layers, and may be coupled through a conductive via 419. The conductive via 419 may pass through the third layer 413 on which the second conductive pattern 417a is formed and the fourth layer 414 on which the third conductive pattern 417b is formed. An end portion 417c of the third conductive pattern 417b may be electrically coupled to a second port group 432 of the image sensor 430 corresponding to the end portion 417c of the third conductive pattern 417b through the wire bonding 418.

An end portion 416b of the first conductive pattern 416a may be electrically coupled to a first port group 431 of the image sensor 430 through the wire bonding 418. In the image sensor portion 410, the conductive via 419 may not be included in a signal transfer path corresponding to the first port group 431. The first port group 431 may be directly coupled to the end portion 416b of the first conductive pattern 416a formed on the second layer 412 without the conductive via 419.

In order for the first port group 431 to be directly coupled to the end portion 416b of the first conductive pattern 416a, the third layer 413 and/or the fourth layer 414 may not be constructed in a region corresponding to a region in which the end portion 416b of the first conductive pattern 416a is disposed.

The end portion 416b of the first conductive pattern 416a and/or the end portion 417c of the third conductive pattern 417b may be formed to have a width thicker than a pattern, thereby making it easy to process the wire boding 418 with the first port group 431 and/or the second port group 432.

At least one of the conductive patterns 416a and 417a may extend to the connector portion 490 through the extension portion 470. For example, the first conductive pattern 416a and/or the second conductive pattern 417a may extend from the image sensor portion 410 to the extension portion 470 and the connector portion 490. In the extension portion 470, at least one of the conductive patterns 416a and 417a may be formed on a surface of the PCB structure 401. Referring to FIG. 5A, the second conductive pattern 417a may be formed on the third layer 413 and thus may be viable when the camera module 400 is viewed. A separate coating layer may be disposed on the conductive pattern to protect and isolate the conductive pattern 417a formed on the surface of the PCB structure 401 from the outside.

The first conductive pattern 416a and/or the second conductive pattern 417a may extend to the connector portion 490 through the extension portion 470. In the connector portion 490, the extended conductive patterns 416a and 417a may be electrically coupled to a component of the electronic device. The connector portion 490 may include the conductive patterns 416a and 417a on the plurality of layers, and may include the conductive via 419 for a connection with a conductive pattern formed on another layer.

A port of the image sensor 430 may be directly coupled to the conductive pattern without passing through the conductive via 419. For example, the first port group 431 of the image sensor 430 may be directly coupled to the end portion 416b of the first conductive pattern 416a formed on the second layer 412 through the wire bonding 418. The first conductive pattern 416a may be formed on the second layer 412. In a region in which the end portion 416b of the first conductive pattern 416a is disposed, the second layer 412 may be a layer constituting a surface of the PCB structure 401. The third layer 413 and the fourth layer 414 may be constructed to overlap with some regions of the second layer 412, and may not be constructed in an open space 415 in which the end portion 416b of the first conductive pattern 416a is disposed. When the fourth layer 414 is viewed, at least part of the first conductive pattern 416a formed on the second layer 412 may be visible.

In the third layer 413 and the fourth layer 414, the open space 415 may be formed, corresponding to the end portion 416b of the first conductive pattern 416a. For example, the third layer 413 may include an opening in the open space 415 corresponding to the end portion 416b of the first conductive pattern 416a. The opening may include a closed-shaped side face. The opening may include a side face coupled to the side face of the third layer 413 or fourth layer 414. Since the third layer 413 and the fourth layer 414 are not constructed between the first port group 431 and the end portion 416b of the first conductive pattern 416a, the first port group 431 may be electrically coupled directly to the first conductive pattern 416a through the wire bonding 418 without the conductive via 419.

In the image sensor portion 410, a path through which a signal from the first port group 431 of the image sensor 430 is transferred may include the first port group 431, the wire bonding 418, or the first conductive pattern 416a. Since the conductive via 419 is not included on the signal transfer path of the image sensor 430, the distortion of the signal corresponding to the first port group 431 may be suppressed. In addition, since the conductive via 419 is omitted, it is possible to avoid that the first conductive pattern 416a formed on the second layer 412 is disposed in a complicated manner.

Figure 6A:
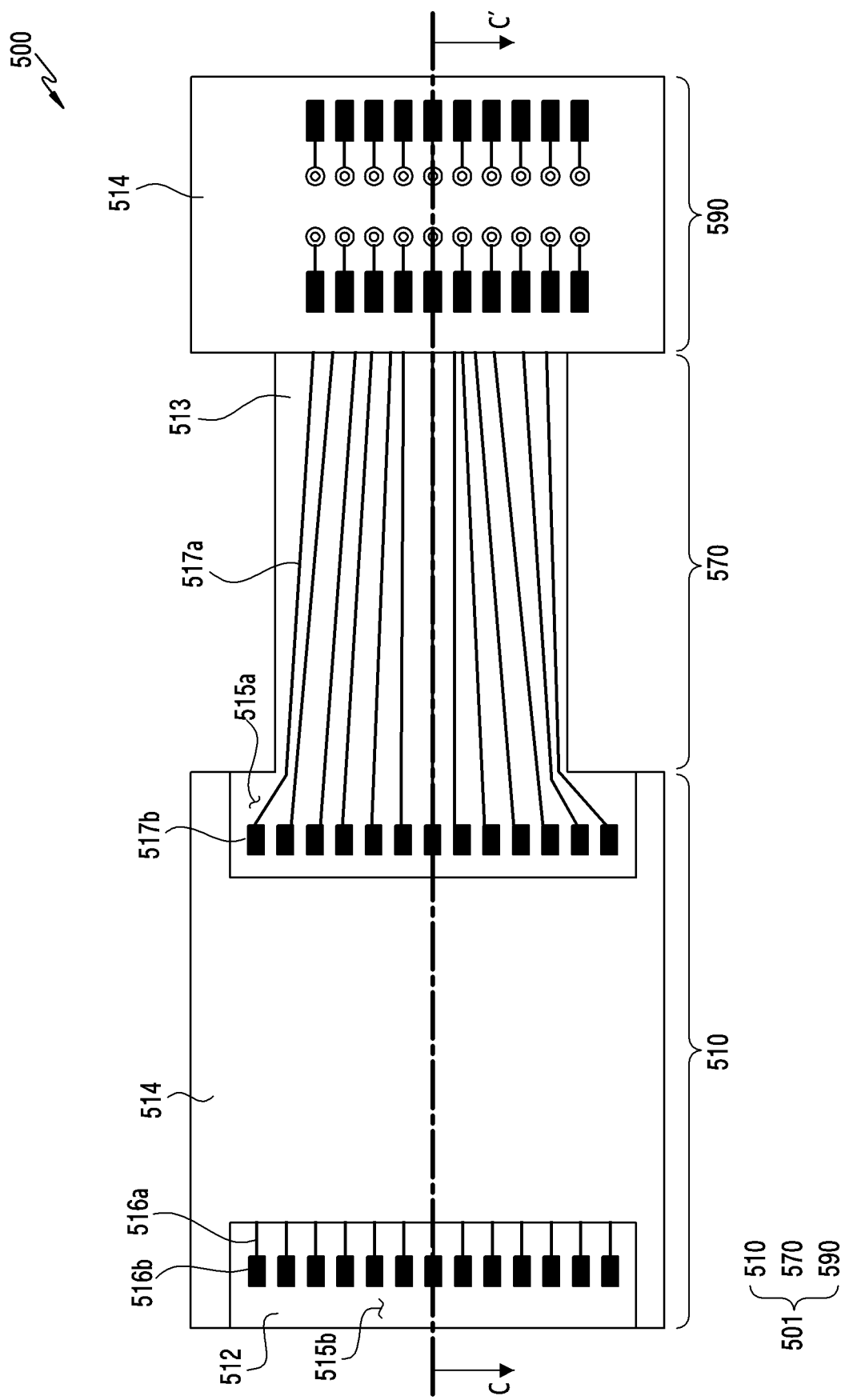
FIG. 6A illustrates an image sensor in the camera module of FIG. 4, according to an embodiment.
Figure 6B:
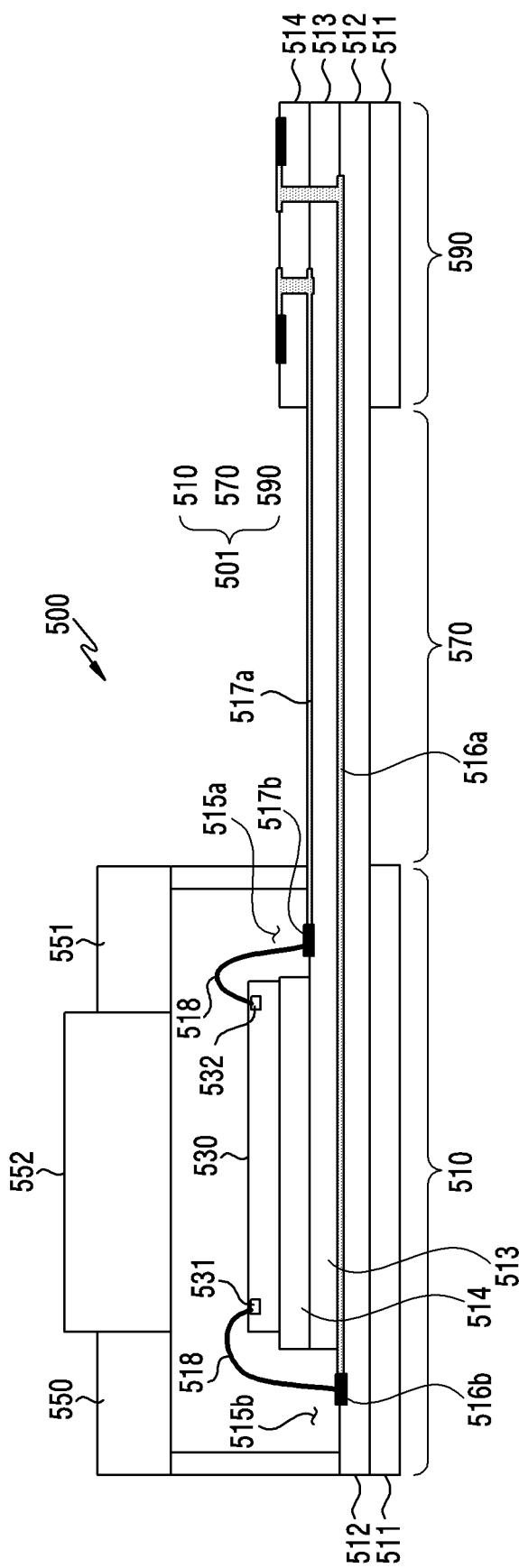
FIG. 6B is a cross-sectional view of the camera module of FIG. 6A, taken along the line C-C', according to an embodiment.

FIG. 6A illustrates a PCB structure, according to an embodiment. FIG. 6B is a cross-sectional view of a camera module 500 including the PCB structure of FIG. 6A, taken along the line C-C', according to an embodiment.

Referring to FIG. 6A to FIG. 6C, the camera module 500 includes a PCB structure 501, an image sensor 530 disposed on the PCB structure 501, and a camera housing 550 disposed to a position corresponding to the image sensor 530 and including a lens 552 and/or a member 551 supporting the lens 552 to the PCB structure 501.

The PCB structure 501 may include an image sensor portion 510 having the image sensor 530 disposed therein, a connector portion 590 electrically coupling the camera module 500 to a component of an electronic device 101, and/or an extension portion 570 coupling the image sensor portion 510 and the connector portion 590.

The image sensor portion 510 may include at least one layer. The image sensor 530 may be disposed to the image sensor portion 510. For example, the image sensor portion 510 may include a first layer 511, a second layer 512 disposed between the first layer 511 and the image sensor 530, a third layer 513 disposed between the second layer 512 and the image sensor 530, and/or a fourth layer 514 disposed between the third layer 513 and the image sensor 530. One of a plurality of layers included in the image sensor portion 510 may overlap with some regions of another layer included in the plurality of layers. For example, the third layer 513 may be constructed to overlap with some regions of the second layer 512, and the fourth layer 514 may be constructed to overlap with some regions of the third layer 513.

Some layers (e.g., the first layer 511 and/or the fourth layer 514) of the PCB structure 501 may include a rigid material. The remaining layers (e.g., the second layer 512 or the third layer 513) may include a flexible material.

The extension portion 570 may include a plurality of layers extending from a plurality of layers of the image sensor portion 510 to the connector portion 590. For example, the extension portion 570 may be a portion from which the second layer 512 and/or third layer 513 of the image sensor portion 510 extend. The second layer 512 or the third layer 513 may extend to the connector portion 590. The extension portion 570 may include a flexible layer. When the extension portion 570 includes the flexible layer, a positional relationship between the image sensor portion 510 and the connector portion 590 may be flexible. For example, one face of the image sensor portion 510 and one face of the connector portion 590 may be disposed to be perpendicular. In addition, a distance from one face of the lens 552 to the second layer 512 of the image sensor portion 510 may be different from a distance from one face of the lens 552 and the second layer 512 of the connector portion 590.

The connector portion 590 may include a plurality of layers. Some of the plurality of layers may be layers extending from the image sensor portion 510. For example, the connector portion 590 may include the first layer 511, the second layer 512, the third layer 513, and/or the fourth layer 514. The second layer 512 and/or the third layer 513 may be layers extending from the image sensor portion 510. The first layer 511 of the connector portion 590 may be separated from the first layer 511 of the image sensor portion 510. For example, the first layer 511 may not be constructed in the extension portion 570. The fourth layer 514 of the connector portion 590 may be separated from the fourth layer 514 of the image sensor portion 510. For example, the fourth layer 514 may not be constructed in the extension portion 570.

The PCB structure 501 may include conductive patterns 516a and 517a such that the image sensor 530 is electrically coupled to a component of the electronic device. At least one of the conductive patterns 516a and 517a may be formed on at least any one of a plurality of layers of the PCB structure 501.

The image sensor 510 may include the first conductive pattern 516a formed on the second layer 512 and/or the second conductive pattern 517a formed on the third layer 513. An end portion 516b of the first conductive pattern 516a may be electrically coupled to a first port group 531 of the image sensor 530 corresponding to the end portion 516b of the first conductive pattern 516a through the wire bonding 518. An end portion 517b of the second conductive pattern 517a may be electrically coupled to a second port group 532 of the image sensor 530 corresponding to the end portion 517b of the second conductive pattern 517a through the wire bonding 518.

The PCB structure 501 may not include the conductive via on a signal transfer path corresponding to the first port group 531 and second port group 532 at least in the image sensor portion 510. The first port group 531 may be directly coupled to the end portion 516b of the first conductive pattern 516a formed on the second layer 512 without the conductive via at least in the image sensor portion 510. In order for the first portion group 531 to be directly coupled to the end portion 516b of the first conductive pattern 516a, the third layer 513 and the fourth layer 514 may not be constructed in a first open space 515a corresponding to the region in which the end portion 516b of the first conductive pattern 516a is disposed.

The second port group 532 may be directly coupled to the end portion 517b of the second conductive pattern 517a formed on the third layer 513 without the conductive via at least in the image sensor portion 510. In order for the second port group 532 to be directly coupled to the end portion 517b of the second conductive pattern 517a, the fourth layer 514 may not be constructed in a second open space 515b corresponding to the region in which the end portion 517b of the second conductive pattern 517a is disposed.

The first conductive pattern 516a and/or the end portion 517b of the second conductive pattern 517a may be formed to have a width thicker than a pattern to make it easy to process the wire boding 518 with the first port group 531 and/or the second port group 532.

At least one of the conductive patterns 516a and 517a may extend to the connector portion 590 through the extension portion 570. For example, the first conductive pattern 516a and/or the second conductive pattern 517a may extend from the image sensor portion 510 to the extension portion 570 and the connector portion 590. In the extension portion 570, the conductive pattern 517a may be formed on a surface of the PCB structure 501. Referring to FIG. 6A, the second conductive pattern 517a may be formed on the third layer 513 and thus may be viable when the camera module 500 is viewed. A separate coating layer may be disposed on the conductive pattern to protect and isolate the conductive pattern formed on the surface of the PCB structure 501 from the outside.

The first conductive pattern 516a and/or the second conductive pattern 517a may extend to the connector portion 590 through the extension portion 570. In the connector portion 590, the extended conductive patterns 516a and 517a may be electrically coupled to a component of the electronic device. The connector portion 590 may include the conductive patterns 516a and 517a on the plurality of layers, and may include the conductive via for a connection with a conductive pattern formed on another layer.

A port of the image sensor 530 may be directly coupled to the conductive patterns 516a and 517a without passing through the conductive via. For example, the first port group 531 of the image sensor 530 may be directly coupled to the end portion 516b of the first conductive pattern 516a formed on the second layer 512 through the wire bonding 518. In the image sensor 510, the first conductive pattern 516a may be formed on the second layer 512. In the region 515a in which the end portion 516b of the first conductive pattern 516a is disposed, the second layer 512 may be a layer constituting a surface of the PCB structure 501. The third layer 513 and/or the fourth layer 314 may be constructed to overlap with some regions of the second layer 512, and may not be constructed in the first open space 515*a* in which the end portion 516*b* of the first conductive pattern 516*a* is disposed. When the fourth layer 514 is viewed, at least part of the first conductive pattern 516*a* formed on the second layer 512 may be visible.

In the third layer 513 and the fourth layer 514, the first open space 515*a* may be formed, corresponding to the end portion 516*b* of the first conductive pattern 516*a*. For example, the third layer 513 may include an opening in the first open space 515*a* corresponding to the end portion 516*b* of the first conductive pattern 516*a*. The opening may include a closed-shaped side face. The opening may include a side face coupled to the side face of the third layer 513 or fourth layer 514. Since the third layer 513 and the fourth layer 514 are not constructed between the first port group 531 and the end portion 516*b* of the first conductive pattern 516*a*, the first port group 531 may be electrically coupled directly to the first conductive pattern 516*a* through the wire bonding 518 without the conductive via.

The second port group 532 of the image sensor 530 may be directly coupled to the end portion 517*b* of the second conductive pattern 517*a* formed on the third layer 513 through the wire bonding 518. In the image sensor portion 510, the second conductive pattern 517*a* may be formed on the third layer 513. In the second open space 515*b* in which the end portion 517*b* of the second conductive pattern 517*a* is disposed, the third layer 513 may be a layer constituting a surface of the PCB structure 301. The fourth layer 514 may be constructed to overlap with some regions of the third layer 513, and may not be constructed in a region in which the end portion 517*b* of the second conductive pattern 517*a* is disposed. For example, referring to FIG. 6A, when the four layer 514 is viewed, at least part of the second conductive pattern 517*a* formed on the third layer 513 may be visible. In the fourth layer 514, the second open space 515*b* may be formed, corresponding to the end portion 517*b* of the second conductive pattern 517*b*. The fourth layer 514 may include an opening in the second open space 515*b* corresponding to the end portion of the second conductive pattern 517*a*. The opening may include a closed-shaped side face. The opening may include a side face coupled to the side face of the fourth layer 514. Since the fourth layer 514 is not constructed between the second port group 532 and the end portion 517*b* of the second conductive pattern 517*a*, the second port group 532 and the second conductive pattern 517*a* may be electrically coupled directly to the second port group 532 through the wire bonding 518 without the conductive via.

In the image sensor portion 510, a path through which a signal from the first port group 531 of the image sensor 530 is transferred may include the first port group 531, the wire bonding 518, or the first conductive pattern 516*a*. Since the conductive via is not included on the signal transfer path of the image sensor 530, the distortion of the signal corresponding to the first port group 531 may be suppressed. In addition, since the conductive via is omitted, it is possible to avoid that the first conductive pattern 516*a* formed on the second layer 512 is disposed in a complicated manner.

In the image sensor portion 510, a path through which a signal from the second port group 532 of the image sensor 530 is transferred may include the second port group 532, the wire bonding 518, or the second conductive pattern 517*a*. Since the conductive via is not included on the signal transfer path of the image sensor 530, the distortion of the signal corresponding to the second port group 532 may be suppressed. In addition, since the conductive via is omitted, it is possible to avoid that the second conductive pattern 517*a* formed on the third layer 513 is disposed in a complicated manner.

Figure 7A:
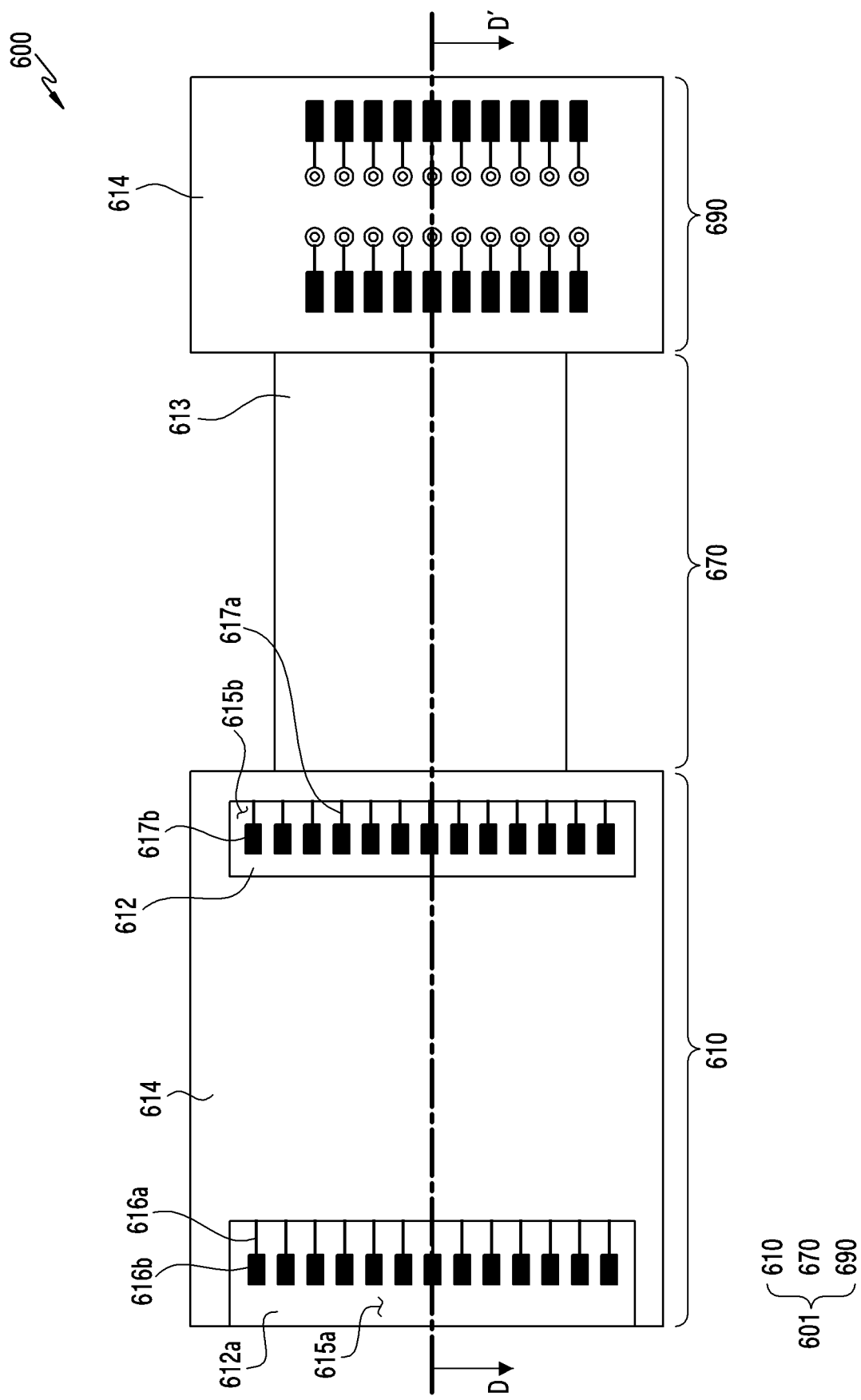
FIG. 7A illustrates that conductive patterns formed on different layers in the camera module of FIG. 6A are formed on the same layer, according to an embodiment.
Figure 7B:
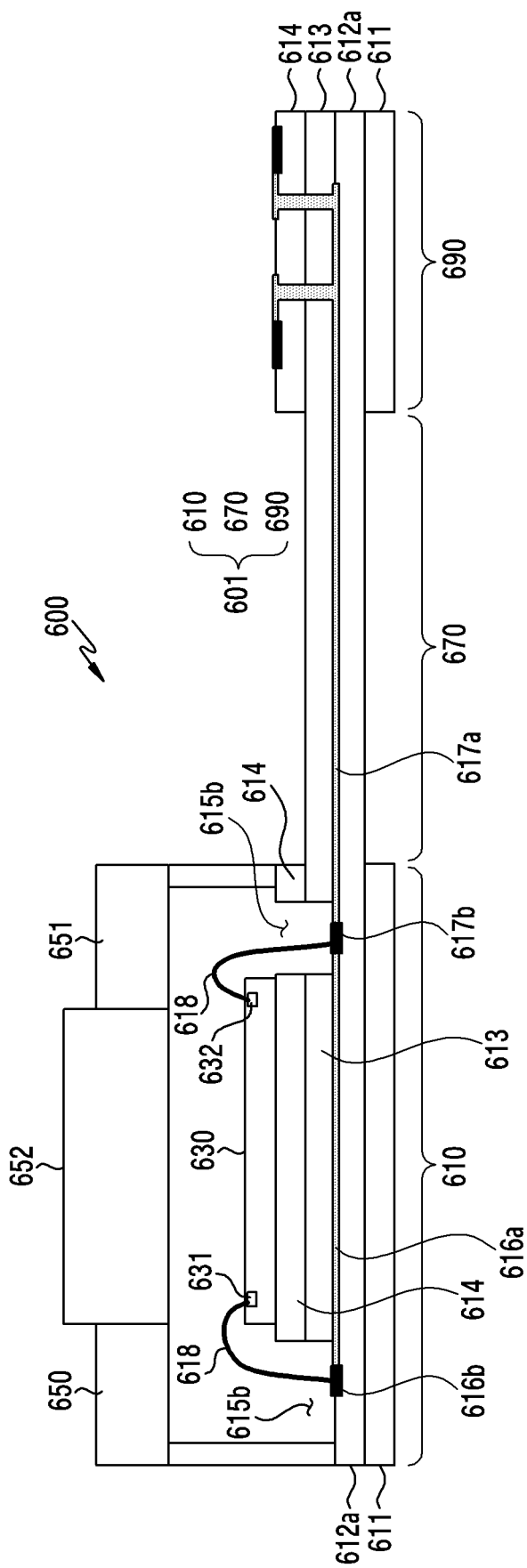
FIG. 7B is a cross-sectional view of the camera module of FIG. 7A, taken along the line D-D', according to an embodiment.
Figure 7C:
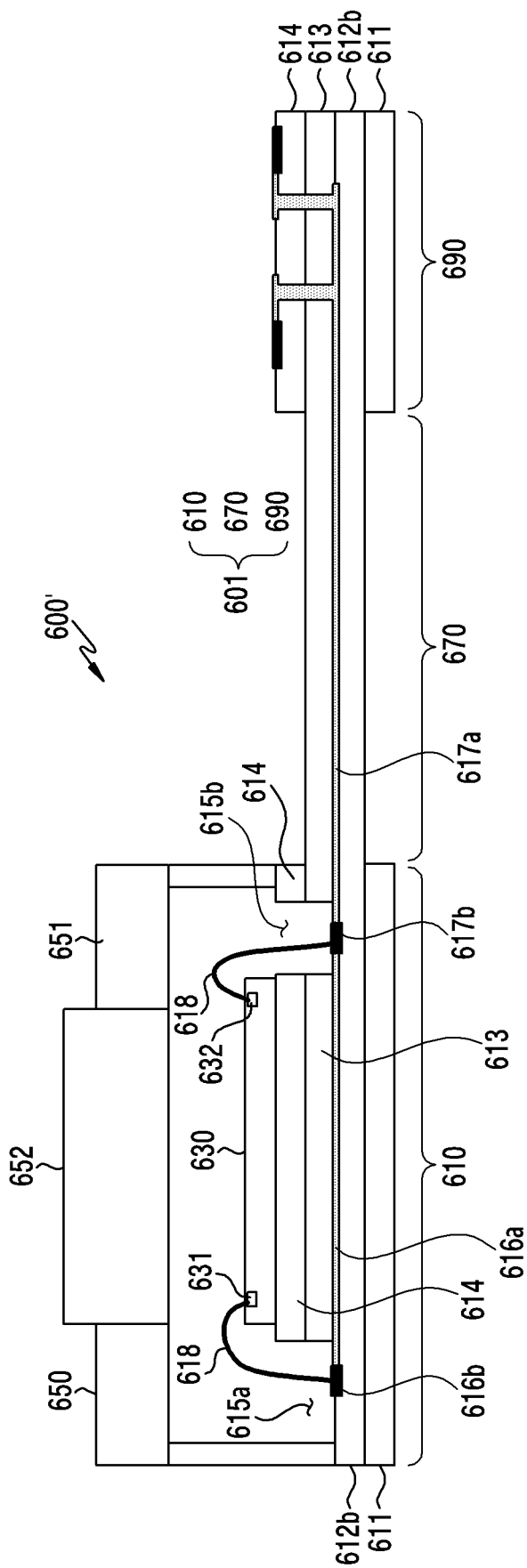
FIG. 7C is a cross-sectional view of the camera module of FIG. 7A, taken along the line D-D', according to an embodiment.

FIG. 7A illustrates conductive patterns formed on the same layer in a camera module 600, according to an embodiment. FIG. 7B and FIG. 7C are cross-sectional views of the camera module 600 of FIG. 7A, taken along the line D-D', according to various embodiments.

Referring to FIG. 7A and FIG. 7B, the camera module 600 includes a PCB structure 601, an image sensor 630 disposed on the PCB structure 601, and a camera housing 650 disposed to a position corresponding to the image sensor 630 and including a lens 652 and/or a member 651 supporting the lens 652 to the PCB structure 601.

The PCB structure 601 may include an image sensor portion 610 having the image sensor 630 disposed therein, a connector portion 690 electrically coupling the camera module 600 to a component of an electronic device 101, and/or an extension portion 670 coupling the image sensor portion 610 and the connector portion 690. The PCB structure 601 may include a first layer 611, a second layer 612*a*, a third layer 613, or a fourth layer 614.

The image sensor portion 610 may include the first layer 611, the second layer 612*a* disposed between the first layer 611 and the image sensor 630, the third layer 613 disposed between the second layer 612*a* and the image sensor 630, and/or the fourth layer 614 disposed between the third layer 613 and the image sensor 630. One of a plurality of layers included in the image sensor portion 610 may overlap with some regions of another layer included in the plurality of layers. For example, the third layer 613 may be constructed to overlap with some regions of the second layer 612*a*, and the fourth layer 614 may be constructed to overlap with some regions of the third layer 613.

The extension portion 670 may include at least one layer extending from a layer of the image sensor portion 610 to the connector portion 690. For example, the extension portion 670 may be a portion from which the second layer 612*a* and/or third layer 613 of the image sensor portion 610 extend. The second layer 612*a* or the third layer 613 may extend to the connector portion 690. The extension portion 670 may include a flexible layer. When the extension portion 670 includes the flexible layer, a positional relationship between the image sensor portion 610 and the connector portion 690 may be flexible.

The connector portion 690 may include a plurality of layers. Some of the plurality of layers may be layers extending from the image sensor portion 610. For example, the connector portion 690 may include the first layer 611, the second layer 612*a*, the third layer 613, and/or the fourth layer 614. The second layer 612*a* and/or the third layer 613 may be layers extending from the image sensor portion 610. The first layer 611 of the connector portion 690 may be separated from the first layer 611 of the image sensor portion 610. For example, the first layer 611 may not be constructed in the extension portion 670. The fourth layer 614 of the connector portion 690 may be separated from the fourth layer 614 of the image sensor portion 610. For example, the fourth layer 614 may not be constructed in the extension portion 670.

The PCB structure 601 may include conductive patterns 616*a* and 617*a* such that the image sensor 630 is electrically coupled to a component of the electronic device 101. The conductive patterns 616a and 617a may be formed on at least any one of a plurality of layers of the PCB structure 601.

The image sensor portion 610 may include the first conductive pattern 616a and/or second conductive pattern 617a formed on the second layer 612a. The first conductive pattern 616a may be a wire which transfers a signal independent of the second conductive pattern 617a. Referring to FIG. 7B, for convenience of explanation, the first conductive pattern 616a and the second conductive pattern 617a are both illustrated in the cross-sectional view. Since the first conductive pattern 616a is separated from the second conductive pattern 617a, only any one of the first conductive pattern 616a and the second conductive pattern 617a may be illustrated in the cross-sectional view, taken along the line D-D'.

An end portion 616b of the first conductive pattern 616a may be electrically coupled to a first port group 631 of the image sensor 630 corresponding to the end portion 616b of the first conductive pattern 616a through the wire bonding 618. An end portion 617b of the second conductive pattern 617a may be electrically coupled to a second port group 632 of the image sensor 630 corresponding to the end portion 617b of a second conductive pattern 617a through the wire bonding 618.

The PCB structure 601 may not include the conductive via on a signal transfer path corresponding to the first port group 631 and second port group 632 at least in the image sensor portion 610. The first port group 631 may be directly coupled to the end portion 616b of the first conductive pattern 616a formed on the second layer 612a without the conductive via at least in the image sensor portion 610. In order for the first portion group 631 to be directly coupled to the end portion 616b of the first conductive pattern 616a, the third layer 613 and the fourth layer 614 may not be constructed in a first open space 615a corresponding to the region in which the end portion 616b of the first conductive pattern 616a is disposed.

The second port group 632 may be directly coupled to the end portion 617b of the second conductive pattern 617a formed on the third layer 613 without a conductive via 619 at least in the image sensor portion 610. In order for the second port group 632 to be directly coupled to the end portion 617b of the second conductive pattern 617a, the third layer 613 and/or the fourth layer 614 may not be constructed in a second open space 615b corresponding to the region in which the end portion 617b of the second conductive pattern 617a is disposed.

At least one of the conductive patterns 616a and 617a may extend to the connector portion 690 through the extension portion 670. For example, the first conductive pattern 616a and/or the second conductive pattern 617a may extend from the image sensor portion 610 to the extension portion 670 and the connector portion 690.

The first conductive pattern 616a and/or the second conductive pattern 617a may extend to the connector portion 690 through the extension portion 670. In the connector portion 690, the extended conductive patterns 616a and 617a may be electrically coupled to a component of the electronic device. The connector portion 690 may include the conductive via such that the conductive patterns 616a and 617a extending to the connector portion 690 are coupled to the conductive pattern formed on another layer.

A port of the image sensor 630 may be directly coupled to the conductive patterns 616a and 617a without passing through the conductive via 619. The first port group 631 of the image sensor 630 may be directly coupled to the end portion 616b of the first conductive pattern 616a formed on the second layer 612 through the wire bonding 618. The first conductive pattern 616a may be formed on the second layer 612. In the region 615a in which the end portion 616b of the first conductive pattern 616a is disposed, the second layer 612a may be a layer constituting a surface of the PCB structure 601. The third layer 613 and/or the fourth layer 614 may be constructed to overlap with some regions of the second layer 612a, and may not be constructed in the first open space 615a in which the end portion 616b of the first conductive pattern 616a is disposed. Referring to FIG. 7A, when the fourth layer 614 is viewed, at least part of the first conductive pattern 616a formed on the second layer 612 may be visible in the first open space 615a.

In the third layer 613 and the fourth layer 614, the first open space 615a may be formed, corresponding to the end portion 616b of the first conductive pattern 616a. For example, the third layer 613 may include an opening in the first open space 615a corresponding to the end portion 616b of the first conductive pattern 616a, The opening may include a closed-shaped side face. The opening may include a side face coupled to the side face of the third layer 613 or the fourth layer 614. Since the third layer 613 and/or the fourth layer 614 are not constructed between the first port group 631 and the end portion 616b of the first conductive pattern 616a, the first port group 631 and the first conductive pattern 616a may be electrically coupled directly to the first port group 631 through the wire bonding 618 without the conductive via 619.

Referring to FIG. 7C, the first conductive pattern 616a is formed on the first layer 611. In this case, the first open space 615a may be constructed in the second layer 612, the third layer 613, and the fourth layer 614, corresponding to the end portion 616b of the first conductive pattern 616a.

The second port group 630 of the image sensor 630 may be directly coupled to the end portion 617b of the second conductive pattern 617a formed on the second layer 612a through the wire bonding 618. In the image sensor portion 610, the second conductive pattern 617a may be formed on the second layer 612a. In the second open space 615a in which the end portion 617b of the second conductive pattern 617a is disposed, the second layer 612a may be a layer constituting a surface of the PCB structure 601. The third layer 613 and/or the fourth layer 614 may be constructed to overlap with some regions of the second layer 612a, and may not be constructed in the second open space 615b in which the end portion 617b of the second conductive pattern 617a is disposed. Referring to FIG. 7A, when the fourth layer 614 is viewed, at least part of the second conductive pattern 617a formed on the second layer 612a may be visible in the second open space 615b.

In the third layer 613 and the fourth layer 614, the second open space 615b may be formed, corresponding to the end portion 617b of the second conductive pattern 617a. For example, the third layer 613 may include an opening in the second open space 615b corresponding to the end portion 617b of the second conductive pattern 617a. The opening may include a closed-shaped side face. The opening may include a side face coupled to the side face of the third layer 613 or fourth layer 614. Since the third layer 613 and/or the fourth layer 614 are not constructed between the second port group 632 and the end portion 617b of the second conductive pattern 617a, the second port group 632 and the second conductive pattern 617a may be electrically coupled directly through the wire bonding 618 without the conductive via 619.

The aforementioned camera module may include an image sensor and a PCB structure electrically coupled to the image sensor. The PCB structure may include a first layer disposed under the image sensor, a second layer disposed between the first layer and the image sensor, a first conductive pattern formed on the first layer and electrically coupled to the image sensor through one end portion of the first conductive pattern so as to transfer a signal obtained from the image sensor to an external electronic component, and a first open space formed in the second layer such that the one end portion of the first conductive pattern is exposed to a surface of the PCB structure.

The PCB structure of the camera module may include a third layer disposed between the second layer and the image sensor, a second conductive pattern formed on the second layer and electrically coupled to the image sensor through one end portion of the second conductive pattern so as to transfer the signal obtained from the image sensor to the external electronic component, and a second open space distinct from the first open space and formed in the third layer such that the one end portion of the second conductive pattern is exposed to the surface of the PCB structure. The first open space may extend to the third layer.

The first conductive pattern of the camera module may correspond to ports of one side of the image sensor. The second conductive pattern may correspond to ports of the other end of the image sensor.

The PCB structure of the camera module may further include a second conductive pattern formed on the first layer and electrically coupled to the image sensor through one end portion so as to transfer the signal obtained from the image sensor to the external electronic component, and a second open space distinct from the first open space and formed on the second layer such that the one end portion of the second conductive pattern is exposed to the surface of the PCB structure.

The PCB structure of the camera module may further include a third layer disposed between the second layer and the image sensor. The first open space and the second open space may extend to the third layer.

The PCB structure of the camera module may further include a layer disposed under the first layer and including a rigid material.

The camera module may include a flexible material.

The PCB structure of the camera module may further include a connector portion which transfers the signal obtained from the image sensor to the external electronic component.

A port of the image sensor corresponding to the first conductive pattern of the camera module may be a port for a mobile industry processor interface (MIPI).

One end portion of the first conductive pattern of the camera module and the image sensor may be electrically coupled through wire bonding.

According to an embodiment, an electronic device may include a housing constituting an inner space, at least one electronic component disposed to the inner space, and a camera module disposed to the inner space. The camera module may include an image sensor and a PCB structure electrically coupled to the image sensor. The PCB structure may include a first layer disposed under the image sensor, a second layer disposed between the first layer and the image sensor, a first conductive pattern formed on the first layer and electrically coupled to the image sensor through one end portion of the first conductive pattern so as to transfer a signal obtained from the image sensor to the at least one external electronic component, and a first open space formed in the second layer such that the one end portion of the first conductive pattern is exposed to a surface of the PCB structure.

The PCB structure of the electronic device may further include a third layer disposed between the second layer and the image sensor, a second conductive pattern formed on the second layer and electrically coupled to the image sensor through one end portion of the second conductive pattern so as to transfer the signal obtained from the image sensor to the at least one external electronic component, and a second open space distinct from the first open space and formed in the third layer such that the one end portion of the second conductive pattern is exposed to the surface of the PCB structure. The first open space may extend to the third layer.

The first conductive pattern of the electronic device may correspond to ports of one side of the image sensor. The second conductive pattern may correspond to ports of the other end of the image sensor.

The PCB structure of the electronic device may further include a second conductive pattern formed on the first layer and electrically coupled to the image sensor through one end portion so as to transfer the signal obtained from the image sensor to the at least one external electronic component, and a second open space distinct from the first open space and formed on the second layer such that the one end portion of the second conductive pattern is exposed to the surface of the PCB structure.

The PCB structure of the electronic device may further include a third layer disposed between the second layer and the image sensor. The first open space and the second open space may extend to the third layer.

The PCB structure of the electronic device may further include a layer disposed under the first layer and including a rigid material.

The first layer of the electronic device may include a flexible material.

The PCB structure of the electronic device may further include a connector portion which transfers the signal obtained from the image sensor to the external electronic component.

A port of the image sensor corresponding to the first conductive pattern of the electronic device according to an embodiment may be a port for a MIPI.

One end portion of the first conductive pattern of the electronic device and the image sensor may be electrically coupled through wire bonding.

In the aforementioned specific embodiments of the disclosure, a component included in the disclosure is expressed in a singular or plural form according to the specific embodiment disclosed herein. However, the singular or plural expression is selected properly for a situation described for the convenience of explanation, and thus the various embodiments of the disclosure are not limited to a single or a plurality of components. Therefore, a component expressed in a plural form can also be expressed in a singular form, or vice versa.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

The invention claimed is:
1. A camera module comprising:
  an image sensor; and a printed circuit board (PCB) structure electrically coupled to the image sensor,
wherein the PCB structure comprises:
a first layer disposed under the image sensor;
a second layer disposed between the first layer and the image sensor;
a third layer disposed between the second layer and the image sensor;
a first conductive pattern formed on the first layer and electrically coupled to the image sensor through one end portion of the first conductive pattern so as to transfer a signal obtained from the image sensor to an external electronic component; and
a second conductive pattern formed on the second layer and electrically coupled to the image sensor through one end portion of the second conductive pattern so as to transfer the signal obtained from the image sensor to the external electronic component,
wherein the second layer forms a first open space,
wherein a surface of the first layer, including an area which the one end portion of the first conductive pattern is disposed, is exposed through the first open space,
wherein the third layer forms a second open space distinct from the first open space,
wherein a surface of the second layer, including an area in which the one end portion of the second conductive pattern is disposed, is exposed through the second open space, and
wherein the first open space extends to the third layer.

2. The camera module of claim 1, wherein the first conductive pattern corresponds to ports of one side of the image sensor, and the second conductive pattern corresponds to ports of the other end of the image sensor.

3. The camera module of claim 1, wherein the PCB structure further comprises:
a third conductive pattern formed on the first layer and electrically coupled to the image sensor through one end portion of the third conductive pattern so as to transfer the signal obtained from the image sensor to the external electronic component,
wherein the second layer forms a third open space distinct from the first open space, and
wherein another surface of the first layer, including an area in which the one end portion of the third conductive pattern is disposed, is exposed through the third open space.

4. The camera module of claim 3,
wherein the first open space and the third open space extend to the third layer.

5. The camera module of claim 1, wherein the PCB structure further comprises a layer disposed under the first layer and includes a rigid material.

6. The camera module of claim 1, wherein the first layer includes a flexible material.

7. The camera module of claim 1, wherein the PCB structure further comprises a connector portion which transfers the signal obtained from the image sensor to the external electronic component.

8. The camera module of claim 1, wherein a port of the image sensor corresponding to the first conductive pattern is a port for a mobile industry processor interface (MIPI).

9. The camera module of claim 1, wherein one end portion of the first conductive pattern and the image sensor are electrically coupled through wire bonding.

10. An electronic device comprising:
a housing constituting an inner space;
at least one electronic component disposed to the inner space; and
a camera module disposed to the inner space,
wherein the camera module comprises:
an image sensor; and
a printed circuit board (PCB) structure electrically coupled to the image sensor, and
wherein the PCB structure comprises:
a first layer disposed under the image sensor;
a second layer disposed between the first layer and the image sensor;
a third layer disposed between the second layer and the image sensor;
a first conductive pattern formed on the first layer and electrically coupled to the image sensor through one end portion of the first conductive pattern so as to transfer a signal obtained from the image sensor to the at least one external electronic component; and
a second conductive pattern formed on the second layer and electrically coupled to the image sensor through one end portion of the second conductive pattern so as to transfer the signal obtained from the image sensor to the external electronic component,
wherein the second layer forms a first open space,
wherein a surface of the first layer, including an area in which the one end portion of the first conductive pattern is disposed, is exposed through the first open space,
wherein the third layer forms a second open space distinct from the first open space,
wherein a surface of the second layer, including an area which the one end portion of the second conductive pattern is disposed, is exposed through the second open space, and
wherein the first open space extends to the third layer.

11. The electronic device of claim 10, wherein the first conductive pattern corresponds to ports of one side of the image sensor, and the second conductive pattern corresponds to ports of the other end of the image sensor.

12. The electronic device of claim 10, wherein the PCB structure further comprises:
a third conductive pattern formed on the first layer and electrically coupled to the image sensor through one end portion of the third conductive pattern so as to transfer the signal obtained from the image sensor to the at least one external electronic component,
wherein the second layer forms a third open space distinct from the first open space, and
wherein another surface of the first layer, including an area in which the one end portion of the third conductive pattern is disposed, is exposed through the third open space.

13. The electronic device of claim 12,
wherein the first open space and the third open space extend to the third layer.

14. The electronic device of claim 10, wherein the PCB structure further comprises a layer disposed under the first layer and includes a rigid material.

15. The electronic device of claim 10, wherein the first layer includes a flexible material.

16. The electronic device of claim 10, wherein the PCB structure further comprises a connector portion which transfers the signal obtained from the image sensor to the external electronic component.

17. The electronic device of claim 10, wherein a port of the image sensor corresponding to the first conductive pattern is a port for a mobile industry processor interface (MIPI).

18. The electronic device of claim 10, wherein one end portion of the first conductive pattern and the image sensor are electrically coupled through wire bonding.

* * * * *